Nov. 12, 1968 R. R. BATCHER 3,411,126

CIRCUIT BOARD DEVICE

Filed June 3, 1966

INVENTOR.

RALPH R. BATCHER

BY

Alfred W. Barber

ATTORNEY 3,411,126

CIRCUIT BOARD DEVICE

Ralph R. Batcher, 240—02 42nd Ave., Douglaston, N.Y. 11363

Filed June 3, 1966, Ser. No. 555,182
1 Claim. (Cl. 339—18)

ABSTRACT OF THE DISCLOSURE

Strips of flexible metal are sandwiched between strips of extruded rubber to form a circuit connector block. The upper edges of the rubber strips are rounded to facilitate the insertion of component leads and the lower edges are rounded so that the inserted leads can be soldered to form a permanent circuit package.

The present invention concerns circuit connector devices and, in particular, methods of and means for providing circuit connectors capable of interconnecting a large number of electronic components in a very small space.

Circuit boards having temporary connection means have been made in the past in a wide variety of sizes and shapes. Such boards generally employ an insulating board in which are inserted metal clips for receiving the leads of components to be interconnected. The metal clips generally accommodate from two to four leads and are spaced in a prearranged pattern or are available as separate parts to be mounted on a board as required.

The present invention concerns a device which permits interconnecting a large number of components in a relatively small space. The contacts in accordance with the present invention are strips of flexible metal sandwiched between strips of resilient rubber. The leads of the components to be interconnected are pushed between the metal strip contacts and the rubber strips which supply contact pressure between the lead and the metal strip and insulation between strips. The present invention is an improvement over the device shown in U.S. Patent No. 3,043,021 which represents the closest known prior art at the time. It has been found that complete circuits employing several transistors, for example, can be interconnected on the present device having a surface approximately 3 inches by 1½ inches, a great saving in space over prior devices. A unique feature of the device according to the present invention is that the metal strips project a slight amount beyond the rubber on the under side permitting soldering of leads and contact strips to form a permanently wired assembly. Dip or wave soldering is possible making the soldering job extremely fast.

These circuit connectors will generally be assembled in a rectangular frame. A further feature can be provided by means of end tabs on the metal strips projecting through openings in the sides of the frame whereby two or more frames can be electrically interconnected.

Accordingly one object of the present invention is to provide an improved circuit board for the assembly and interconnection of electronic circuits.

Another object is to provide a very compact and inexpensive circuit board.

A still further object is to provide a simple, compact and inexpensive circuit board which can be used for temporary or experimental circuit assembly and which can readily be converted into a permanent circuit by soldering.

A further object is to provide circuit board assemblies which interconnect by means of simple contact provisions without resorting to wiring to plugs and sockets in the usual manner.

These and other objects will be apparent from the detailed description of the invention given in connection with the various figures of the drawing.

In the drawing:

FIGURE 8 is an enlarged detail of one form of assembly in accordance with the present invention while

Figure 1:
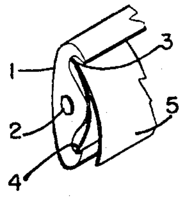
FIGURE 1 is a view in perspective of one of the combination contact and insulating strips used in the assembly.

FIGURE 1 shows a contact combination of an insulator strip 1 of elastomeric material such as soft rubber, for example, having a longitudinal hole 2 for increased resilience, upper lip 3 and lower lip 4 retaining the folded spring contact strip 5. A typical contact combination is 0.5 inch wide by 0.125 inch thick and 1.5 inches long although it is not intended to limit the invention to these dimensions. The resilient strip 1 has essentially an oval cross-section with a hole running through its center and upper and lower lips formed to grip the metal contact strip 5. This resilient strip 1 is to provide electrical insulation between adjacent contact strips when assembled and to provide resilience to press component leads against the metal contact strips 5. The rounding of the upper edges of strips 1 greatly assists the insertion of the component leads. Strip 1 may be extruded of soft rubber or other similar resilient and insulating elastomeric material. Contact strip 5 may be of metal spring material such as Phosphor bronze, spring brass or aluminum or spring steel. Contact strip 5 may also be plated with protective metal such as tin, silver, zinc or gold.

Figure 2:
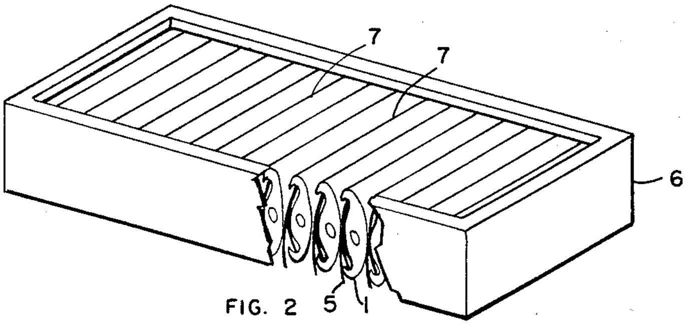
FIGURE 2 is a view in perspective of a typical assembly in accordance with the present invention.
Figure 3:
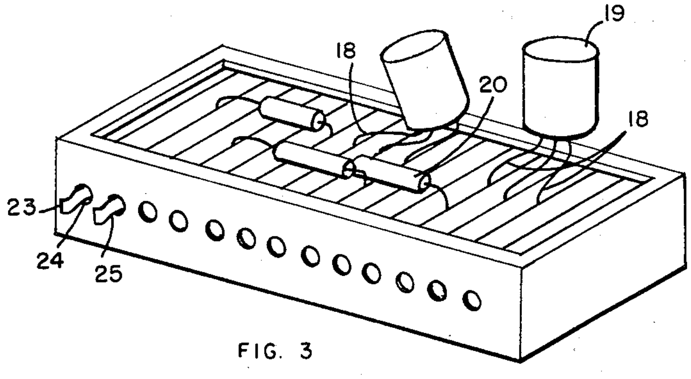
FIGURE 3 is a view similar to that of FIGURE 2 and showing some typical electronic components assembled on the circuit connector.

FIGURE 2 shows how a plurality of the combination insulator and contact strips may be assembled in a four sided plastic box 6 having retaining lips 17. When so assembled, the insulator and contact strips are squeezed together and a series of grooves 7 between the rounded upper edges of the insulators are evident between the strips into which the leads 18 of electrical or electronic components 19–20 may be inserted as shown in FIGURE 3. Leads inserted at any point along one of the grooves are interconnected by its associated contact strip. It will be seen how the oval shape of the insulators results in grooves between the rows of contacts making the insertion of component leads simple, quick and sure.

Figure 4:
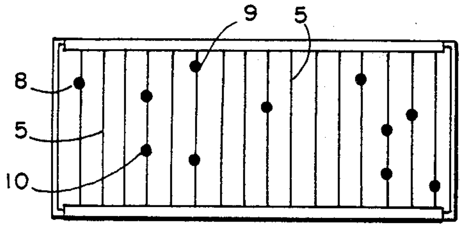
FIGURE 4 is a bottom view of a typical circuit connector in accordance with the present invention showing how circuits can be made permanent by soldering.

FIGURE 4 shows the under side of the assembly of FIGURE 3 showing the edges of the contact strips 5 with leads 8, 9 and 10 in contact therewith. A permanent circuit assembly may be completed by soldering these leads 8, 9 and 10 to their adjacent contact strips 5. Thus, experimental "bread board" circuits may be tested and worked over and then converted into a permanent piece of equipment. Duplicates may be made readily to provide short-run productions.

Figure 5:
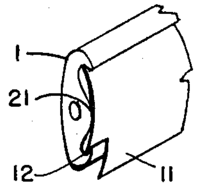
FIGURE 5 is a view of an alternate connector contact form to that of FIGURE 1.

An alternate form of contact strip is shown in FIGURE 5 where contact strip 11 is provided with a tab 12 which slips into the lower groove of insulator strip 1 for retaining the lower edge of the contact strip while the entire upper edge fits in the upper groove. Alternatively strips 1 and 11 may be bonded along their line of contact starting at area 21.

Figure 6:
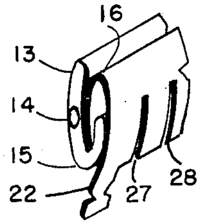
FIGURE 6 is a view of still another alternate connector contact form.

Another form of insulator strip and contact strip is shown in FIGURE 6. Here insulator strip 13 includes a lower lip 15 for retaining one edge of folded contact strip 16. Insulator 13 also has a longitudinal hole 14 for increased resilience. Contact strip 16 may be provided with a tab 22 permitting interconnection with other strips or connection with external devices. Strip 16 may also be slit at intervals 27–28 providing longitudinal flexibility whereby leads of different diameters are contacted without mutual interference. Bonding of insulator 13 to contact 16 along its upper edge will prevent inserting leads in the wrong slots.

Figure 7:
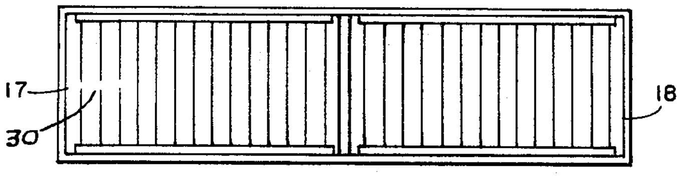
FIGURE 7 is a view of two circuit connector assemblies which are mounted end-to-end to provide increased component handling capacity.

FIGURE 7 illustrates how two groups of contact assemblies may be mounted together to provide additional circuit capacity.

Figure 8:
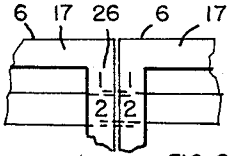

Circuit or row members as shown at 26 in FIGURE 8 may be provided along the lip 17 of box 6 to assist in following or designating circuit connections.

Figure 8A:
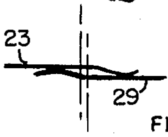
FIGURE 8A shows a detail of the interconnecting contacts.

FIGURES 3 and 8A also illustrate how by providing projecting tabs 23 and 29 on the ends of the contact strips projecting through holes 24–25 in frame 6 two or more frames can be gang connected side-by-side to form large assemblies. Since no additional plugs, sockets or wiring is required, a great saving in wiring time and parts cost provided.

Some of the unique advantages of the device in accordance with the present invention should be emphasized. The relatively wide grooves into which the component lead wires are inserted make assembly easy, fast and almost fool-proof. Since the insulating strips extend substantially above the upper edges of the contact strips, shorting between strips by a metal cased component is prevented and leads may extend over the tops of several strips also without danger of shorting.

A simple but effective modification to increase the circuit capacity of a frame is shown in FIGURE 7 where at 30 several of the conductive strips are cut apart or segmented permitting two isolated circuits in one row.

While only a few forms of the present invention have been shown and described, many modifications will be apparent to those skilled in the art and within the spirit and scope of the invention as set forth, in particular, in the appended claim.

What is claimed is:

1. A circuit board device for electronic circuit assembly, including in combination;

a rectangular frame including a top-side and a bottom-side;

a plurality of alternate rows of resilient elastomeric strip insulators and resilient strip conductors assembled within said frame;

wherein said insulators are rounded along both upper and lower edges to facilitate the insertion of circuit component leads between said rows and in contact with said conductors along said upper edges and to expose said conductors and leads for soldering in the grooves formed between said lower edges;

and wherein said insulators are grooved longitudinally between said edges to position said conductors;

and wherein said conductors are fitted into the latter said grooves and are proportioned and so positioned as to lie below said upper edge of said insulators and to project substantially into the first said grooves along the lower edges of said insulators.

References Cited

UNITED STATES PATENTS

| | | | |
|---|---|---|---|
| 2,240,180 | 4/1941 | Frank | 339—21 |
| 2,441,461 | 5/1948 | Wayne | 339—21 |
| 2,680,233 | 6/1954 | McFarlin | 339—21 |
| 2,922,135 | 1/1960 | Hoberg et al. | 339—18 |
| 3,043,021 | 7/1962 | Thompson | 35—19 |
| 3,072,874 | 1/1963 | Roney | 339—17 |
| 3,116,960 | 1/1964 | Olsson et al. | 339—128 |
| 3,148,438 | 9/1964 | Winter et al. | 339—18 X |
| 3,299,393 | 1/1967 | Kelley et al. | 339—18 |

MARVIN A. CHAMPION, *Primary Examiner.*

PATRICK A. CLIFFORD, *Assistant Examiner.*